(12) United States Patent
Thakur

(10) Patent No.: US 6,669,782 B1
(45) Date of Patent: Dec. 30, 2003

(54) METHOD AND APPARATUS TO CONTROL THE FORMATION OF LAYERS USEFUL IN INTEGRATED CIRCUITS

(76) Inventor: Randhir P. S. Thakur, 5261 Apennies Cir., San Jose, CA (US) 95138

( * ) Notice: Subject to any disclaimer, the term of this patent is extended or adjusted under 35 U.S.C. 154(b) by 30 days.

(21) Appl. No.: 09/712,341

(22) Filed: Nov. 15, 2000

(51) Int. Cl.$^7$ .......................... C23C 16/00; H05H 1/00
(52) U.S. Cl. ..................... 118/715; 118/712; 118/695; 156/345.24; 156/345.26
(58) Field of Search ................................ 118/715, 724, 118/725, 730, 712, 695; 156/345.24, 345.25, 345.26, 345.28, 345.33

(56) References Cited

U.S. PATENT DOCUMENTS

| | | | | |
|---|---|---|---|---|
| 4,647,172 A | * | 3/1987 | Batchelder et al. | 396/570 |
| 4,989,544 A | * | 2/1991 | Yoshikawa | 118/723 E |
| 5,635,409 A | * | 6/1997 | Moslehi | 438/7 |
| 5,885,402 A | * | 3/1999 | Esquibel | 156/345.25 |

OTHER PUBLICATIONS

Max Schulz, "The End of the Road for Silicon", Jun. 99, PP 729–730, VOL 399, Nature.
Kunio Saito et al "Reaction and Film Properties of Selective Titanium Silicide Low–Pressure Chemical Vapor Deposition", J. Electrochem. Soc; PP 1879–1885, vol. 141, Jul. 1994.
Eiji Takeda et al "Current Reliability Issues and Future Technologies for Systems on Silicon—Processes, Circuits, Chip Archtecture, and Design", Microelectronics Reliability, Pergamon PP 897–908.
S.S. Mani et al "Effect of W Coating on Microengine Performance", IEEE, PP 146–151, 38$^{Th}$ IRPS, 2000.
John Baliga, "Read–Write Leads Follow Steep Progress", Semiconductor International, Sep. 2000, PP 95–102.
Richard P. Wayne, "Principles and Applications of Photochemistry", Oxford University Press, 1988, PP 1–5.
Martin Klessinger etal, "Excited States and Photochemistry of Organic Molecules", from *Photochemical Reaction Modules*, PP 309–320, 1995.
P. K. Wright, "Semiconductor Manufacturing", 21$^{st}$ *Century Manufacturing*, Prentice Hall, PP 130–170, Year 2000.

* cited by examiner

*Primary Examiner*—Parviz Hassanzadeh

(57) ABSTRACT

An apparatus for forming at least one layer of substantially homogenous material on a substrate comprising: a processing chamber having a substrate support system on which is disposed a wafer; an energy source for providing thermal or a-thermal energy to the chamber; a source of reactants for the chamber; and a "smart controller" connected to the chamber for "real-time" control of the energy sources and the reactant sources. Additionally a method for forming at least one layer of substantially homogenous material layer on a substrate, comprising: in-situ cleaning of the substrate by selectively using appropriate amounts of thermal, sonic, optical and plasma energy while comparing actual surface topography of the substrate with an expected surface topography via said "smart controller".

15 Claims, 6 Drawing Sheets

METHOD AND APPARATUS TO CONTROL THE FORMATION OF LAYERS USEFUL IN INTEGRATED CIRCUITS

FIELD OF THE INVENTION

The present invention is generally directed to integrated circuits and a process for the formation thereof. More specifically, present invention is directed to the improved performance, reliability, and yield of semiconductor and other related devices by providing material layers having desired functionalities (DF), desired performance (DP), and built in reliability (BIR).

BACKGROUND OF THE INVENTION

The invention of the transistor in 1948 followed by the invention of integrated circuits in 1957 has led to the development of modern microelectronics, which is globally considered as the driver of economic growth. The heart of the modem microelectronics are the silicon integrated circuits or popularly known as silicon chips. Lower cost, high speed, smaller size, and improved reliability of each generation of silicon chips are responsible for the sustained economic growth in the last three decades.

A global examination of the advanced electronic, optical, mechanical, chemical and biological products show that the advances in the field of silicon chip technology have benefited directly or indirectly the manufacturing of other products. As an example of the direct benefit, the success of silicon chip led to the development of the field of solid free form fabrication (SFF) and rapid prototyping (RP). Some details of SFF and RP are described in Chapter 4, "Solid free form fabrication (SFF) and rapid prototyping" of the book, "$21^{st}$ Century Manufacturing" pp. 130–170, 2000 by P. K. Wright, which is also incorporated herein by reference. Another example of the direct benefits of silicon chip technology is the development of DNA chips and micro-arrays. Some details of DNA chips and micro-arrays are described in an article and titled "DNA Micro-array (genome Chips)", by L. Shi, httD://www.gene-chips.com, which is also incorporated herein by reference. Indirectly, the development of improved controllers, high performance robots, information systems as well as improved precision has helped every manufacturing industry. As a specific example of indirect benefits, more and more things that used to be controlled by mechanical or electro-mechanical systems in a closed loop are driven now by silicon chip based microprocessors.

Currently, most advanced silicon chips are using circuits with feature size of 180 nm. At the cost of several billion dollars, the silicon IC industry is currently in the process of switching from 200 mm diameter wafers to 300 mm diameter wafers. Many experts are predicting that in near future, further shrinking of silicon ICs is coming to end. Some of these issues are discussed in an article titled, "The End of the Road for Silicon", M. Schultz, Nature, vol. 99, pp. 729–730, 1999, which is also incorporated herein by reference.

In order to keep the success of silicon IC industry moving in the $21^{st}$ century, the introduction of new materials, further reduction of the parasitic resistance and capacitance, use of higher aspect ratios of vias and trenches is a necessity. The conventional methods of deposition such as physical vapor deposition have several disadvantages in terms of step coverage, control of stoichiometry of the films and the possibility of selective deposition. Conventional chemical vapor deposition (CVD) techniques also are not suitable for the fabrication of future silicon ICs. As an example, one of the most serious problems concerned with conventional CVD of low resistivity metal films used in the sub-100 nm silicon IC fabrication is the rough surface morphology due to the presence of the large crystal grains. Some of these issues are discussed in an article titled, "Reaction and Film Properties of Selective Properties of Selective Titanium Silicide Low-Pressure Chemical Vapor Deposition", K. Saito and co-workers, Journal of Electrochemical Society, vol. 141, pp. 1879–1885, 1984, which is also accompanied by reference. Though plasma enhanced CVD has improved surface morphology, the main disadvantage comes in terms of the damage caused to the surface and substrate. Thus, there is a need to invent a CVD technique, which overcomes all of, previously mentioned drawbacks and offers a very low contact resistance.

The manufacturing of sub-70 nm CMOS ICs will also require invention of processing techniques that can provide very high quality junctions. Techniques such as molecular beam epitaxy, and excimer laser annealing for junction formation are being investigated. However, these techniques suffer from severe drawbacks in terms of throughput and defects. Conventionally substrate heating is used during laser crystallization to increase the melt duration and therefore decrease the nucleation rate. This leads to longer processing cycle times and increased manufacturing complexity apart from causing lateral temperature gradients leading to high thermal stress. Also the very high energy density excimer lasers used during the processing beyond the lateral growth regime leads to the roughness at the interface. Small geometry devices are more susceptible to interface roughening as a result of much faster cooling. The use of high energy density lasers also causes blisters on surface. This would not only result in high surface damage, but also degrade device parameters like minority carrier lifetime due to microscopic defects created during the process.

The challenge faced by silicon IC industry is to invent processes land equipment that are capable of providing devices with feature size as small as 1–10 nm using substrates of the diameter in the range of 300 mm and higher. From system point of view, future systems on Chip will have diverse functions (e.g. computing, sensing, imaging, servo mechanics, memory etc.) all integrated on a single chip. These complex systems on chip will be low-cost, ultra small and highly reliable. In order to meet future challenges of silicon IC chips and other related products, the layers of materials grown, deposited or processed on different substrates will have horizontal and or vertical dimensions as small as 1 nm. These different layers of materials either patterned by lithography or written directly will be used in the development of chips having components of the order of millions to billions with diverse functionalities. Due to the chip complexity, testing of such chips may be more expansive than the manufacturing cost. Some of these issues for developing future systems on chip are described in an article and titled, "Current reliability issues and future technologies for systems on silicon-process, circuits, chip architecture, and design", Takeda et al, Microelectronics and Reliability, Vol. 40, pp. 897–908, 2000, which is also incorporated herein by reference.

In future, a single layer of material will have to perform more than one function. As an example, the gate material used in the fabrication of metal-insulator field effect transistor (MISFET) will have to provide appropriate work function as well as a barrier against the transportation of any type of defects or flaws (microscopic as well as macroscopic) into the gate dielectric material.

In the fabrication of micro-electromechanical systems (MEMS), stiction and wear are two major problems. Some of these issues of MEMS are described an article and titled, "Effect of W Coating on Microengine Performance", Mami et al., Proc. 2000 IEEE international reliability Physics Symposium Proc. pp. 146–151, 2000, which is also incorporated herein by reference. The reduction of micro-roughness at each surface and interface as well as reduction of stress can improve the performance and reliability of all MEMS products.

Devices based on magnetic materials such as hard disk storage, magnetic static random access memory (MRAM) etc. also need defect free, and stoichiometric films. Some of the materials used in the magnetic devices are usually a few nanometer thick, as described in an article, "Read-Write Heads," J. Baliga, Semiconductor International, vol. 23 (10), pp. 95–102, 2000, which is also incorporated herein by reference.

Thermal processing is an integral part in the formation of different layers used in the fabrication of electronic, magnetic, optical and super conducting devices. As compared to thermal energy, the photochemical and photo physical effects associated with the use of photons (with wavelength less than about 800 nm) have the advantage of using excited states. Some details of thermal and photochemical reactions are described in Chapter 1, "Basic Principles of Photochemistry" of the book, *Principles and Applications of Photochemistry*, pp. 1–5, 1988 written by R. P. Wayne, which is also incorporated herein by reference.

The use of electronic excited states in the formation of material can lead to the reduction of processing time, reduction of processing temperature, reduction of microscopic defects and thermal stress. In the case of removal of material, the use of electronic excited state is very important in the residual removal by providing volatile products. This concept is very important for etching new materials (e.g. $IrO_2$, $PbLaZrTiO_3$ etc.) that are supposed to be important in the fabrication of sub-100 nm feature size circuits. Some details of electronic excited states are described in Chapter 6, "Photochemical Reaction Models" of the book, "Excited States and Photochemistry of Organic Molecules," pp. 309–320, 1995 by M. Kiessinger and J. Michl, which is also incorporated herein by reference.

Therefore, a need currently exists for a way to form and remove layers of material having desired functionalities (DF) with desired performance (DP) and built in reliability (BIR) on silicon and other substrates for manufacturing advanced electronic, optical, mechanical, chemical, and biological products, as well as low-cost complex Systems-on Chip (SOC).

SUMMARY OF THE INVENTION

The present invention recognizes and addresses the forgoing disadvantages, and others of prior art constructions, techniques and methods.

Accordingly, it is an object of the present invention to provide a process for forming a layer of material having desired functionalities (DFs) with desired performance (DP) and built in reliability (BIR) on silicon and other substrates.

Another object of the present invention is to provide a process for forming or removing a layer of material with microscopic homogeneity on silicon and other substrates using infinitesimal sources of materials in gaseous, liquid or solid form, infinitesimal thermal and a-thermal sources of energy.

Another object of the present invention is to choose chemical reaction paths in the formation of a material.

Another object of the present invention is to provide process for forming a layer of material with thickness ranging from a single monolayer to several microns.

Another object of the present invention is to provide the in-situ processing (e.g. in-situ cleaning of the surface of the substrate, restoration of crystalline surface material with minimum surface defects, in-situ formation and or in-situ deposition and in-situ annealing) capabilities of layer formation.

It is another object of the present invention to provide a process for forming a layer of material with minimum microscopic and macroscopic defects on a substrate useful in the formation of integrated circuits.

The inventive apparatus comprises a processing chamber in which is disposed a silicon or other related substrate or work piece. The substrate can be in vertical or horizontal arrangement within the chamber. The chamber provides material supplies (solid, liquid, and gases), as well as thermal and a-thermal energy sources. The thermal energy is preferably supplied to the substrate from the backside of the wafer (i.e., the side where no deposition, formation or processing takes place). The a-thermal energy, as well as the layer forming materials, can be supplied to the substrate from either front and/or backside of the substrate.

The substrate can be rotated at a predetermined speed. A ring provided outside the substrate supplies the liquid and/or gaseous materials used in the formation of the layer. The ring structure provides the flexibility of introducing complex reactants, as well as reactant heating and/or cooling environments separately without making changes to the existing chamber and the systems. Such an arrangement substantially isolates the chamber walls, and a local cleaning of the ring structure can also be performed.

If the reactants are changed such that the partial pressure and/or the reactant concentration are altered, the ring structure can be easily replaced and a new ring sub-system can be introduced. In essence, the ring structure permits the accurate, timely, and well-monitored delivery of a multitude of gaseous, liquid, and solid precursors. Further, the ring system conditions the reactants to enter the environment in the vicinity of the substrate such that a mono-layer for integrated circuits with sub-100 nm feature sizes are formed with repeatability and controllability, thereby increasing device reliability.

The primary processing criteria is also important. The inventive system is automated to fulfill the factory automation requirements. The costs of ownership improvements are important embodiment of this invention. The throughput and footprint improvements that are, substantially different than prior art are disclosed here to provide the cost of ownership advantages to the user.

The inventive chambers are flexible, thereby facilitating lateral, as well as vertical expansion of the system. In the case of lateral expansion, multiple substrates are processed in the same chamber. The substrates are introduced such that the reaction environment throughout the chamber is substantially the same.

As a specific example, if the metal films (for application in interconnect system of an integrated circuit) are to be deposited at a temperature of 400° C., we propose to introduce one, two, three or four substrates simultaneously and the thermal and the reactant delivery components of the system is optimized such that all substrates heat to similar temperatures uniformly, independent of the thermal mass, and reactants distribute themselves such that the concentration of the species is uniform across all substrates. Such uniform heating is accomplished via multiple thermal sources and the reactant uniformity is optimized to provide concentration of the reactant species.

The above described system can be used not only to process integrated circuits, but can also be used to process other devices such as, but not limited to lasers, light emitting diodes, and modulators.

BRIEF DESCRIPTION OF THE DRAWINGS

A full and enabling disclosure of the present invention, including the best mode thereof, to one of the ordinary skill in the art, is set forth more particularly in the remainder of the specification, including reference to the accompanying figures, in which:

FIGS. 1–6 shows some of the features of the system used for forming layers of materials with desired functionalities (DFs), desired performance (DP) and built-in reliability (BIR) on a substrate and for performing a number of processing steps (e.g. junction formation, deposition and etching of dielectrics, metals, superconductors and semiconductors, nitridation, oxidation, electroplating, chemical mechanical polishing etc.) used in the fabrication of various elemental and compound semiconductor devices as well as based on organic semiconductors, discrete and monolithically integrated circuits and devices on a common substrates (e.g. systems on a chip) nano-electronics, microelectronics, molecular electronics, opto-electronics, solar cells, flat panel display devices, spintronics, information storage devices and magnetic devices.

DETAILED DESCRIPTION OF THE PREFERRED EMBODIMENTS

Figure 1:
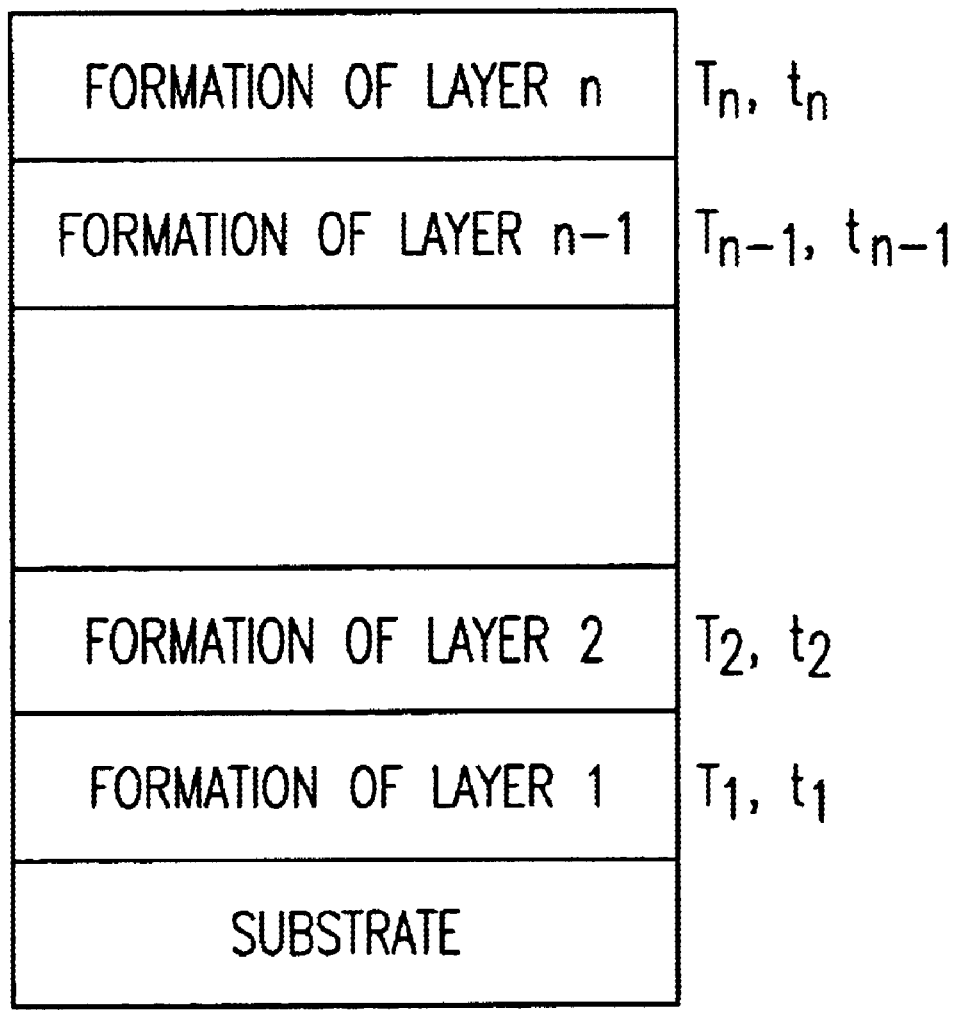
FIG. 1 illustrates the concept used in the design of a smart controller to control processing time and temperature to get the desired topography of the layer formed.

It is to be understood by one of the ordinary skill in the art that the present discussion is a description of exemplary embodiments only, and is not intended as limiting the broader aspects of the present invention which broader aspects are embodied in the exemplary construction.

In general, the present invention is directed to a system and the process used in the fabrication of silicon and compound semiconductor integrated circuits, devices and circuits used in optical and wireless networks, opto-electronics, microelectronics, nano-electronics, flat panel displays and magnetic data storage devices. The equipment and the processes of the present invention have a number of applications. For example, in one embodiment, the equipment and the process of the present invention is directed to form a layer of solid material on a coated or virgin substrate using thermal and various a-thermal energy sources, a "smart controller" having wired and wire-less connections to other in-situ and ex-situ controllers for real-time control of various thermal and a-thermal energy sources and flow of fluids (liquid, gases, vapors, plasmas) and beams and in-situ and ex-situ non-contact material characterization tools and other stored data information that is used in the formation of substantially homogenous microstructure materials.

As an application of the present invention, semiconductors, dielectrics, barriers and conducting materials having substantially homogenous microstructure with desired functionalities (DFs), desired performance (DP) and built-in reliability (BIR) can be formed for manufacturing silicon integrated circuits with feature size as small as 20 nm. In another applications of the present invention, the process and equipment of the present invention can be used to etch semiconductors, dielectrics, barrier and conducting homogenous materials that are used in the fabrication of integrated circuits with feature size as small as 20 nm. In another application, the equipment and the process of the present invention can be used to form and etch materials used in the monolithical integration of high capacitance discharge capacitors with silicon integrated circuits on the common silicon substrate. In another embodiment of the present invention, the equipment of the present invention can be used in the fabrication of homogenous materials used in optical devices such as modulators, lasers etc. and the monolithical integration of various discrete optical devices can be achieved on a common substrate. In another embodiment of the present invention, the equipment and process of the present invention can be used to fabricate materials used in the fabrication of micro-electro-mechanical systems on silicon and other systems. In another embodiment of the present invention, the equipment and process of the present invention can be used to fabricate nano-dimension materials. In another embodiment of the present invention, the equipment and process of the present invention can be used to deposit materials based on viscous precursors with performance and reliability better than possible by spin-on method. Moreover, in another embodiment of the present invention, the equipment and process of the present invention can be used to form and etch magnetic thin film materials that will be required for shrinking the device dimensions, tolerance and the signal to noise ratio of the future magnetic recording systems.

The present invention is directed to different embodiments for achieving the objectives listed in previous paragraph. As described below, each embodiment offers various benefits and advantages depending on a particular application of a specific embodiment. In the present invention, the separation of thermal and a-thermal energy sources allow the precise control of bonding arrangements required to shrink the horizontal and vertical dimension of various kind of semiconductor, optical, magnetic devices as well as micro-electro-mechanical systems. An incoherent light source generally provides photons in the wavelength regions of about 50 nm to several microns. The photons with energy density of the order of several microwatts per cm$^2$ to several mill watts per cm$^2$ in the wavelength region of 50 nm to 400 nm contribute temperature rise less than room temperature (~25–30° C.). The photons of the above wavelength and energy density range when used in conjunction with other thermal and a-thermal energy sources provide materials having homogenous microstructure with desired functionalities (DFs), desired performance (DP) and built-in reliability (BIR). This is due to the fact that the use of thermal energy alone in the formation of a layer of material leads to statistical fluctuation in the position of atoms and molecules of the layer farther away from thermal equilibrium position. As a result pure thermal energy sources leads to the formation of defects. As compared to plasma sources, the photons of same energy provide lower momentum. For example, calculations based on quantum mechanics shows that the ratio of momentum of 10 eV Argon plasma and 10 eV photons is about $10^5$. Thus, due to lower momentum, the use of incoherent photons over plasma of similar energy leads to bonding arrangements with no electrically active defects.

By using two separate incoherent photon energy sources, one in the wavelength range of 50–200 nm and below the other in the range of 200–400 nm and higher, the bonding arrangements of the material to be formed by the present invention can be tailored to meet the desired properties. The selection of a particular energy source depends on the absorption properties of the precursor fluids, layer being formed and the substrate. By using only the desired amount of energy, the defect free bonding arrangement is obtained. Such selective and precise use of energy sources results into lower amount of energy consumed and therefore the material formed by the present invention, results into reduced stress and very controlled stoichiometry. This matter photon. interaction is also responsible for depositing films that have better electrical performance compared to the conventional deposition methods.

The description below relates to some preferable materials and processes used in the formation of critical modules of integrated circuits.

The substrates used in the current invention may be flexible non-conducting polymer on which a homogenous microstructure metal, dielectric, semiconductor, or superconductor material with desired functionalities (DFs), desired performance (DP) and built-in reliability (BIR) is formed. The unit or plurality of substrates are transferred for the formation of the layer by chemical and or physical routes of material synthesis by selectively using the appropriate amount of thermal, sonic, optical and plasma energy and layer by layer monitoring and controlling the desired surface topography matching with the ideal topography of each layer. A preferable example included herein relates to the formation of the gate dielectric by the process of monolayer oxidation of silicon surface followed by the graded deposition by chemical vapor deposition of $SiO_xN_y$ by the selective use of the appropriate amount of thermal, sonic, optical and plasma energy and layer by layer monitoring and controlling the desired surface topography matching with the ideal topography of each layer to get the last layer of the dielectric as $Si_3N_4$.

These deposition steps to form silicon based ultra thin deposited dielectrics (silicon dioxide, silicon nitride, silicon oxynitride) may used as a gate dielectric material of silicon carbide, diamond, organic semiconductors, indium phosphide, gallium arsenide, and gallium arsenide metal-insulator-semiconductor field effect transistor (MISFET).

Prior to dielectric deposition, ex-situ cleaning of the substrate followed by in-situ cleaning of the patterned or non-patterned substrate by selectively using the appropriate amount of thermal, sonic, optical, plasma energy for a desired time to get the desired surface topography matching with the expected surface of the patterned or non-patterned substrate may be carried out. Additionally, chemical vapor deposition of the gate dielectrics by the process of mono-layer deposition of silicon dioxide followed by the layer-by-layer graded deposition of $SiO_xN_y$ and other dielectrics may be performed. Layer by layer monitoring and controlling of the actual surface topography matching with the expected topography of each layer to get the last layer of the dielectric as $Si_3N_4$.

The transistor formation for logic and other application specific devices such as micro controllers and DRAM capacitors in the future will entail most material, defect density, and reliability challenges. The apparatus and method of present invention shall substantially solve those challenges. Some of the high dielectric constant materials (e.g. tantalum pentoxide, barium strontium titanate etc.) and others deposited epitaxially (e.g. $CaF_2$, $CeO_2$, $Y_2O_3$, $ZrO_2$ etc.) when processed using present invention also provide the expected topography and impact the final yield. Other materials used to support the integration of the dielectric are the top and bottom electrodes (metal such as Pt, Ru etc. and or conducting oxides such as $RuO_2$) which also benefit from present invention both from the apparatus and method aspect.

Each embodiment of the present invention will now be described in great detail.

EQUIPMENT AND PROCESS TO FORM A SUBSTANTIALLY HOMOGENOUS LAYER OF A MATERIAL ON A SUBSTRATE

In the first embodiment, the equipment and process of the present invention is used to form a layer of solid homogenous material on a substrate. The various embodiments of the present invention are particularly illustrated in FIGS. 1, 2, 3, 4, 5 and 6. The use of various kinds of energy sources (thermal, sonic, photonic and plasma) will be optimized in such a way that the processing temperature, processing time, and thermal stress will be reduced in every processing step. As shown in FIG. 1, the thermal energy experienced by first layer is the sum of thermal energy used in the formation of all layers. Thus the displacement of dopants $d_1$, in the first layer is given by following equation:

$$d_1 = \text{sqrt}(D_1{}^*t_1 + D_2{}^*t_2 + \cdots + D_{n-1}{}^*t_{n-1} + D_n{}^*T_n)$$

Where $D_i$ is the diffusion coefficient at temperature $T_i$ and $t_i$ is the processing time. The displacement of dopants $d_2$, in the second layer is given by following equation:

$$d_2 = \text{sqrt}(D_2{}^*t_2 + \cdots + D_{n-1}{}^*t_{n-1} + D_n{}^*T_n)$$

By using similar reasoning for the control of surface topography by the use of various energy sources, precise amount of energy will be used in the formation or removal of a particular layer. The use of exactness in the selection of various energy sources will provide materials with desired functionalities, desired performance and built-in reliability.

Figure 2:
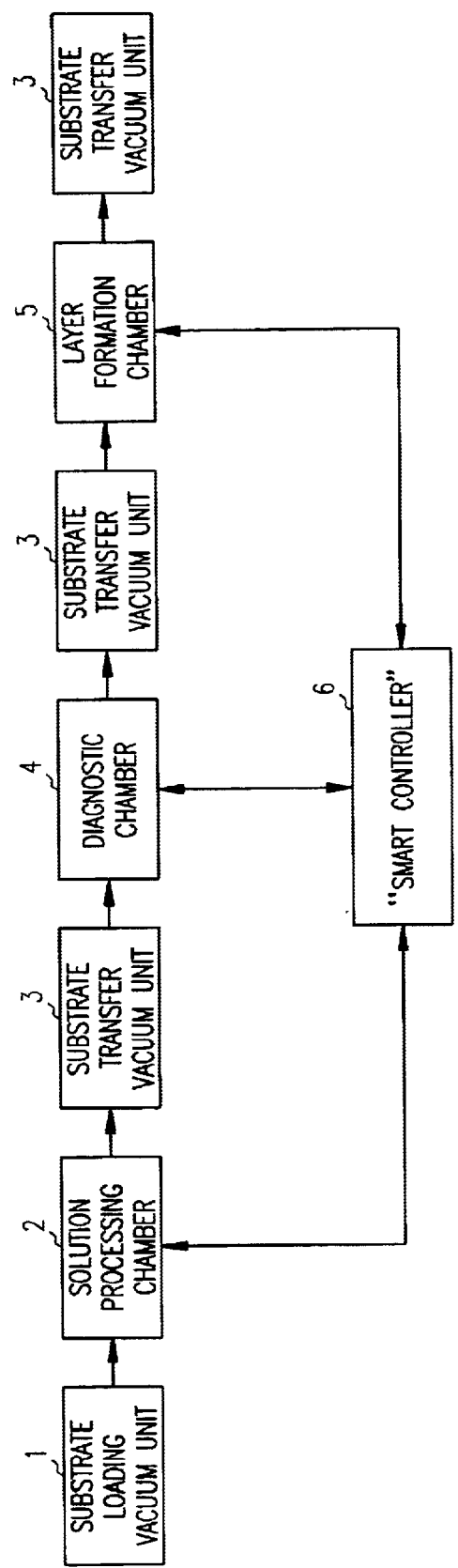
FIG. 2 is a block diagram illustrating one embodiment of the present invention in which multiple chambers are used for forming a layer of material on a substrate.

As shown in FIG. 2, the equipment consist of a substrate loading unit 1, solution processing chamber 2, three substrate transfer vacuum units 3, diagnostic chamber 4, the layer formation chamber 5 and the "smart controller" 6. The substrate-loading unit 1 is connected to the solution-processing chamber 2. The solution-processing chamber consists of surface cleaning by using wet chemistry processing or any chemicals as needed. It may also consist of solution-processing tool to achieve a self-assembled layer by organic or inorganic methods. After solution processing, through substrate transfer vacuum unit 3, the substrate is transferred to diagnostic chamber 4. The diagnostic chamber consists of contact or non-contact measurement, testing and mapping capability and serves as an important input to the smart controller. The substrate transfer unit 3 is used to transfer the substrate back and forth between the diagnostic chamber 3 and the layer formation chamber 5. The "smart controller" 6 communicate and controls various signals back and forth with the solution processing chamber 2, diagnostic chamber 34 and the layer formation chamber 5. Finally, after layer formation and measuring the designed diagnostic properties of the formed layer, the substrate is transferred to the next system through the substrate transfer unit 3.

The "smart controller" 6 has the capability to store the ideal topography of the layer to be formed at successive interval of time. During the solution processing or layer formation, the in-situ diagnostic tool located in solution processing chamber 2 or layer formation chamber 5, collects the data in real time. The in-situ real-time data of the substrate or layer is communicated to the "smart controller" 6 and both the fluid-flow and the energy distribution and intensity of various thermal and a-thermal energy sources are adjusted in real time to obtain the desired topography of the substrate or the layer. The "smart controller" also has the capability of testing, debugging and running diagnostic tests of equipment of FIG. 2 through a wired or wireless Internet communication.

Figure 3:
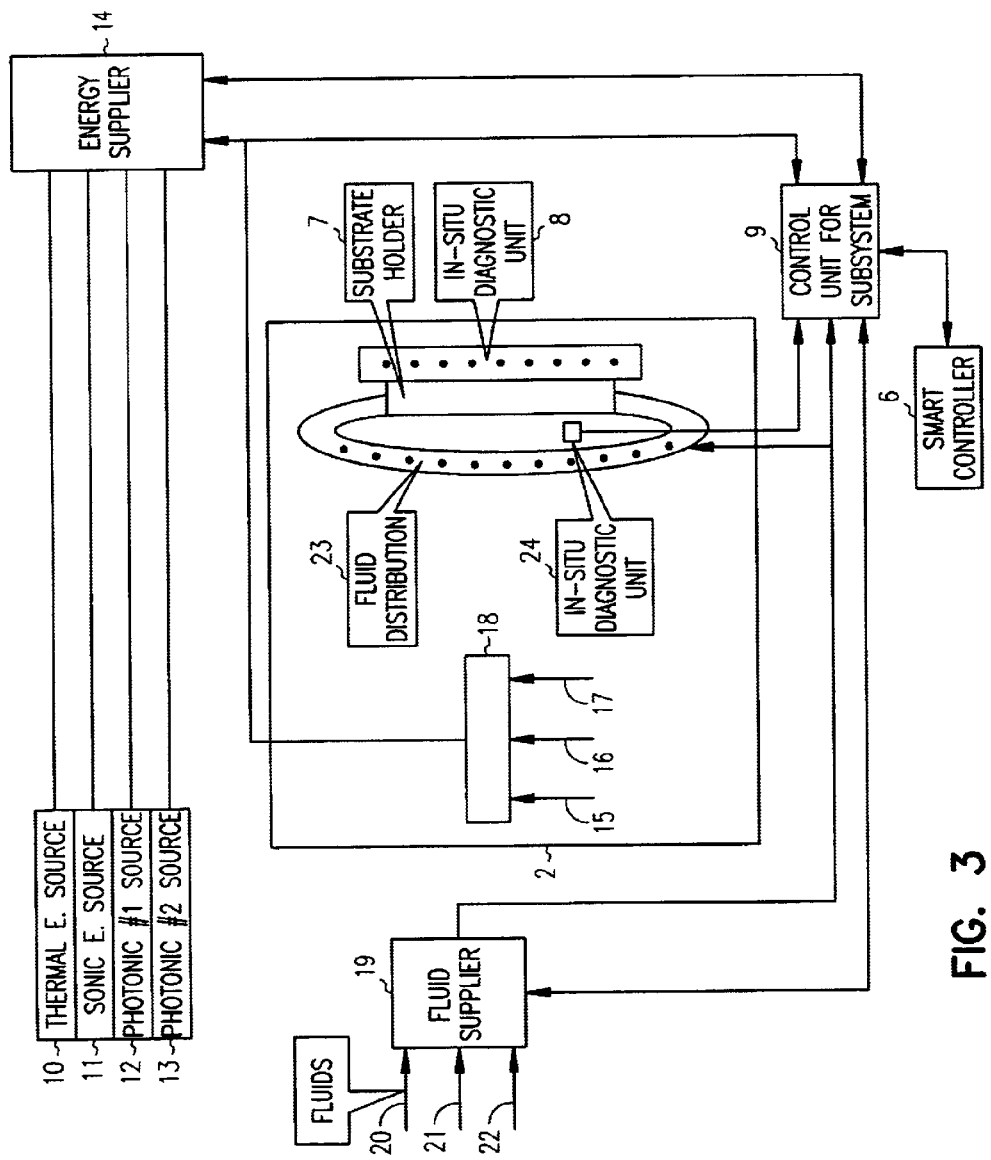
FIG. 3 is a plan view of a representative solution-processing chamber used in the system of FIG. 2, according to the present invention.

FIG. 3 is a plain view of one embodiment of solution processing chamber that may be used in the system illustrated in FIG. 2. The substrate holder 7, thermal energy source 8, solution distributor 23, in-situ diagnostic unit 24, sonic energy source 17, photonic energy source (wavelength range of 200–400 nm) 16, photonic energy source (wavelength range of 50–00 nm) 15, and the device to select one or more a-thermal energy sources 18 are all located in-side the solution processing chamber. The substrate holder also has the capability of rotating the substrate at a predetermined speed. The power supply of thermal energy source 10, sonic energy power supply 11, power supply for photonic energy source (wavelength range of 200–400 nm) 12, power supply for photonic energy source (wavelength range of 50–200 nm) 13, energy supplier 14, controller unit 9, fluid supplier 19, and various fluids including their own reservoirs and electronic mass flow-controllers 20, 21, and 22, and the smart "process controller" are located outside the solution processing chamber 2. The "smart controller" 6 communicates with controller 9, which communicate with fluid supplier 19, energy supplier 14, and in-situ diagnostic unit 24. The non-contact in-situ diagnostic unit 24 is capable of collecting real-time data at multiple locations on the substrate and communicates to "smart controller" through controller unit 9. The non-contact in-situ diagnostic unit 24 may be based on x-ray diffraction, atomic force microscopy, scanning tunneling microscopy or ellipsometry.

It should be understood that besides placing the substrate on the substrate holder, the substrate could also be placed in a container having one or more solutions, thermal energy supplying unit, sonic transducer, and mechanism to introduce one or more gases in the container.

Figure 4:
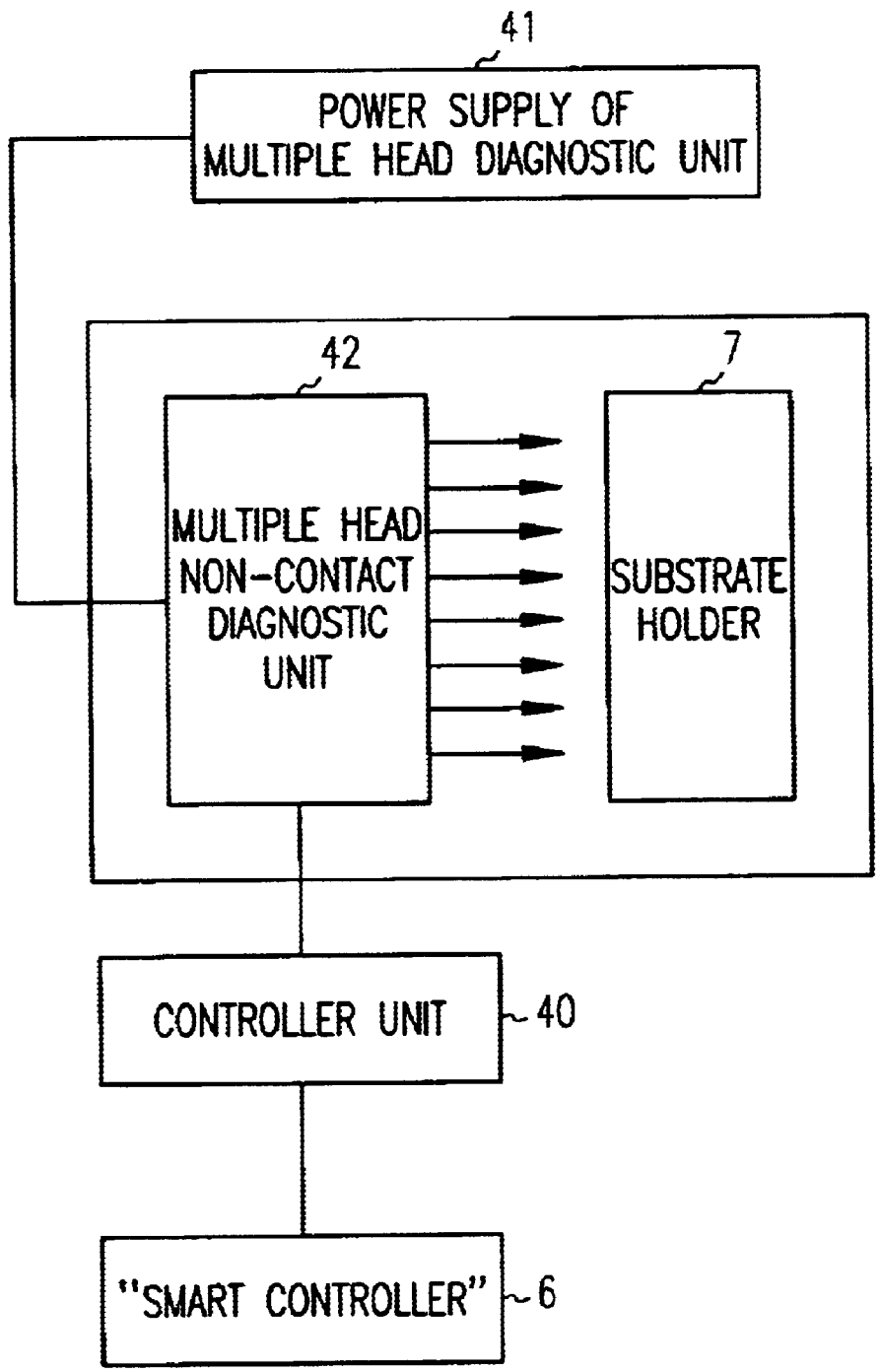
FIG. 4 is a plan view of a representative diagnostic chamber used in the system of FIG. 2, according to the present invention.

FIG. 4 is a plain view of one embodiment of diagnostic chamber that may be used in the system illustrated in FIG. 2. The multiple-head diagnostic unit 42 is located above the substrate holder 7 and is placed inside the diagnostic chamber 3. The power supply unit 41 is placed outside the diagnostic chamber 3. The controller unit 40 is connected to "smart controller" 6 and the multiple-head diagnostic unit 42. The topography of the formed layer on the substrate can be determined by the diagnostic chamber and communicated to the layer formation chamber 5. As an example, the multiple-head diagnostic unit 42 is based on atomic force microscopy or scanning tunneling microscopy. As shown in FIG. 2, through substrate transfer vacuum unit 3, the diagnostic chamber can generate the topography of the formed layer during or after the layer formation. After forming certain thickness of the layer, the substrate can be taken out of chamber 5 and brought to diagnostic chamber 4 for generation of topography of the formed layer. Through "smart controller" the data obtained by the diagnostic chamber can be used to get the desired topography of the formed layer.

Figure 5:
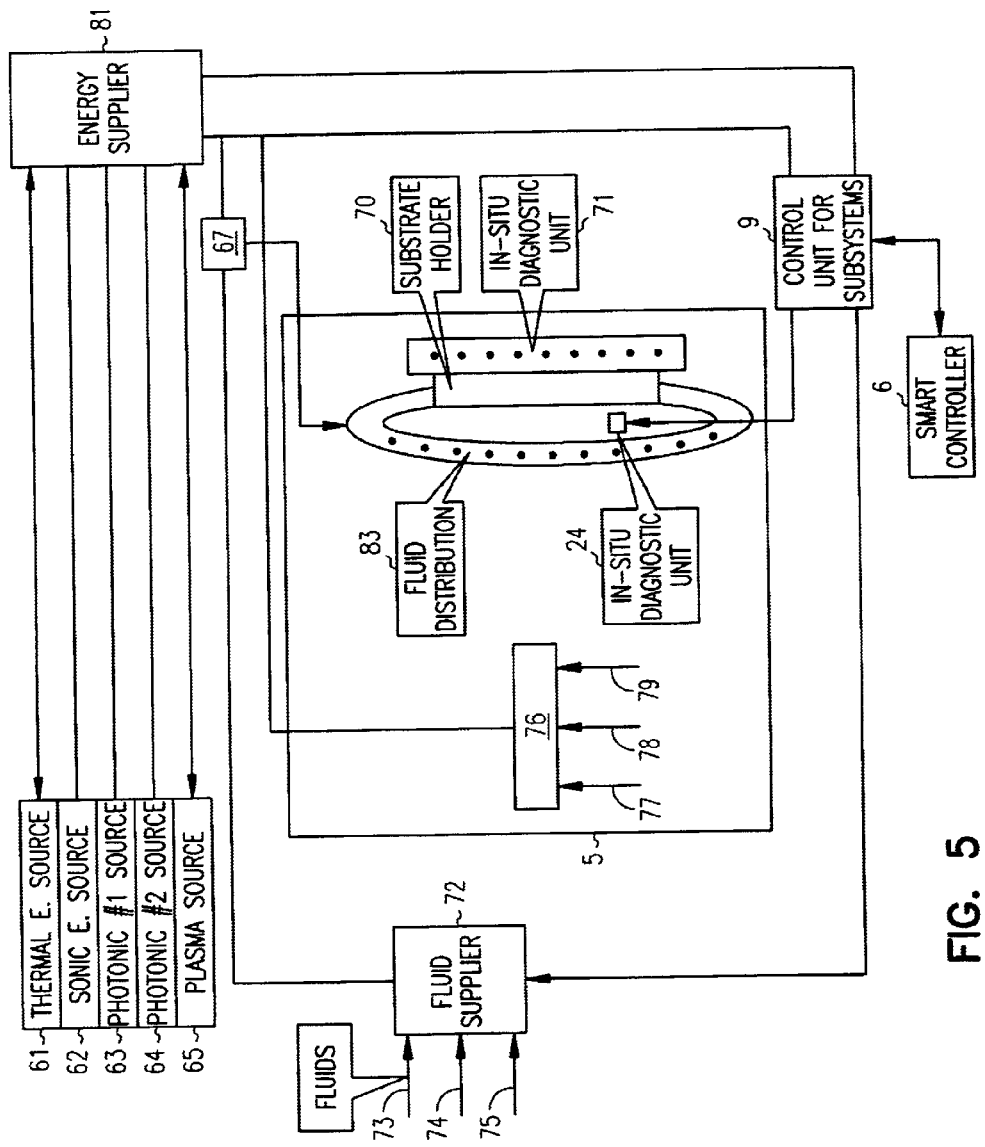
FIG. 5 is a plan view of a representative layer-forming chamber used in the system of FIG. 2, according to the present invention.

FIG. 5 is a plain view of one embodiment of layer formation chamber that may be used in the system illustrated in FIG. 2 The substrate holder 70, thermal energy source 71, fluid distributor 83, in-situ diagnostic unit 24, sonic energy source 77, photonic energy source (wavelength range of 200–400 nm) 78, photonic energy source (wavelength range of 50–200 nm) 79, and the device to select one or more a-thermal energy sources 76 are all located in-side the layer formation chamber. The substrate holder 70 also has the capability of rotating the substrate at a predetermined speed. The power supply of thermal energy source 61, sonic energy power supply 62, power supply for photonic energy source (wavelength range of 200–400 nm) 63, power supply for photonic energy source (wavelength range of 50–200 nm) 64, plasma energy source 65, remote plasma chamber 67, remote plasma connecting device to chamber 5, energy supplier 81, controller unit 69, fluid supplier 72, and various fluids including their own reservoirs and electronic mass flow-controllers 73, 74, and 75, and the smart "process controller" are located outside the layer formation chamber 5. The "smart controller" 6 communicates with controller 9, which communicate with fluid supplier 72, energy supplier 81, and in-situ diagnostic unit 24. The non-contact in-situ diagnostic unit 24 is capable of collecting real-time data at multiple locations on the substrate and communicates to "smart controller" through controller unit 9. The non-contact in-situ diagnostic unit 24 may be based on x-ray diffraction, atomic force microscopy, scanning tunneling microscopy or ellipsometry. ellipsometry.

Figure 6:
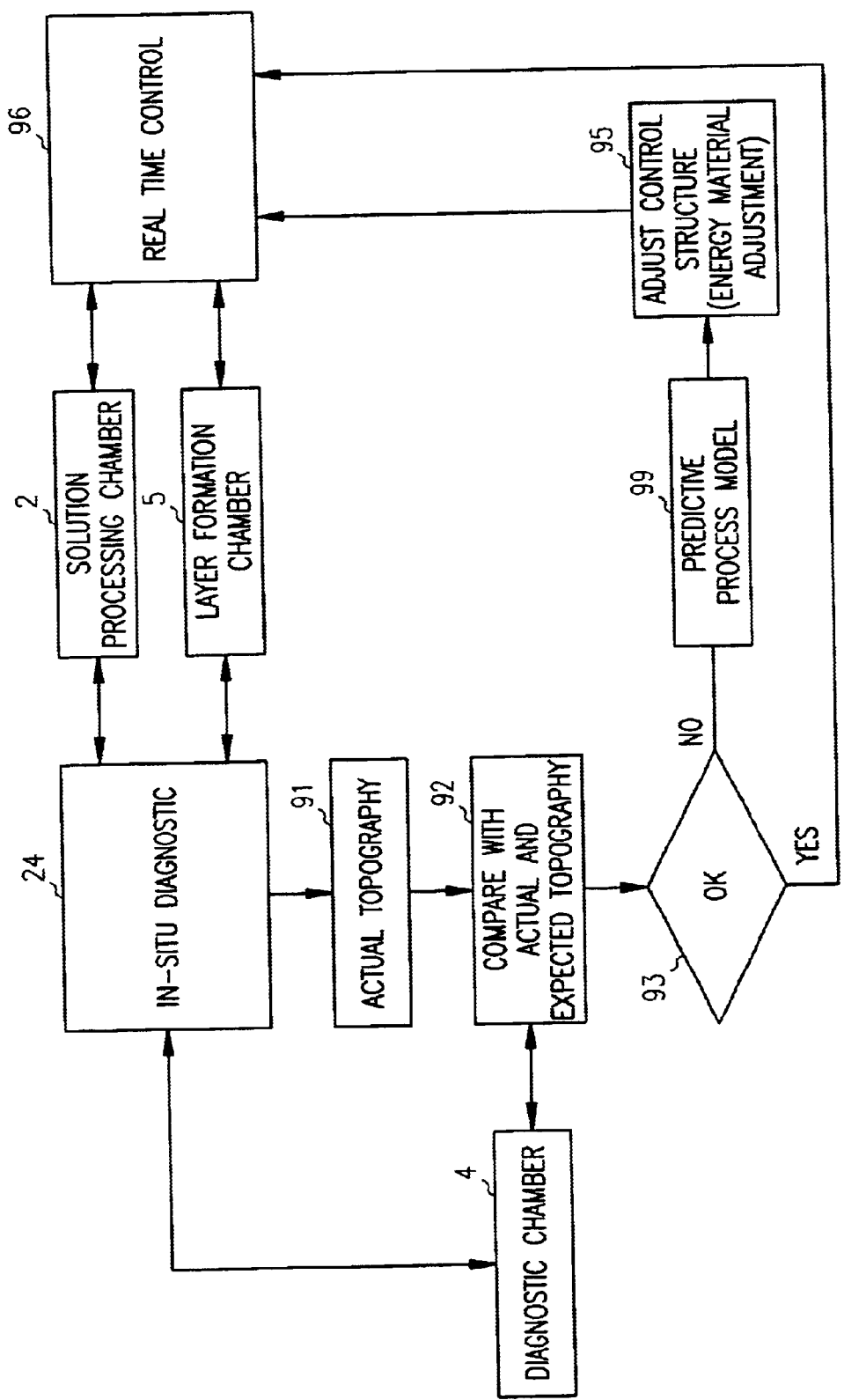
FIG. 6 is a plan view of key-features of "smart controllers" and its integration with solution processing chamber, diagnostic chamber and layer formation chamber.

FIG. 6 shows several features of the "smart controller". The in-situ diagnostic unit 24 is sub-part of the solution chamber 2 and the layer formation chamber 6 and is also interfaced with the diagnostic chamber 4.

The expected topography of the layer formed is stored in sub-unit 91. Sub-unit 92 carries out the comparison of the actual and desired topography. The decision making process shown in sub-unit 93 has two out puts. If the out put of the sub-unit 93 is "yes", the information is carried out to the real time control unit 96 and the process continues.

However, if the out put of the sub-unit 93 is "no", the information is communicated to the predictive process model 99. The predictive process model has the capability of predicting the process dependence on all the energy source parameters and fluid or solution distribution parameters. The predictive process model consists of a number moduli such as fluid flow module, energy selector module, layer formation or layer removal module, microscopic defect module, etc. The predictive process model is capable of handling all thickness regions (from single monolayer to several micron range) involving the equilibrium and non-equilibrium phenomena associated with the layer formation or layer removal. The predictive process model also takes into consideration the quantum effects involved in the layer formation or removal of sub 10–30 nm thickness (depending on the material formed or removed). In the development of predictive process control model, all type of non-linear physical, chemical, and mechanical phenomena involved in the material formation or removal have been taken into consideration.

Thus, to get the desired topography, a new set of energy and fluid parameters is supplied to the real time control unit 96. This new set of parameter is used to further carry out the process sequence to complete the layer formation in solution chamber 2 or layer formation chamber 5.

The equipment of FIG. 2 can be used for in-situ cleaning of the substrate by solution processing, and or by anhydrous dry cleaning as well as for forming the layers on the substrate. By using the solution chamber of FIG. 3, it is also possible to produce desired thickness (from monolayer to several microns) of the self-assembled layers of desired solid materials. Such self-assembled layers may act as a seed to further grow layer of similar or different material on the substrate or may serve as a functioning material with desired performance and built-in reliability. The layer formation chamber of FIG. 5 in conjunction with the diagnostic chamber of FIG. 4 and the solution chamber of FIG. 3 can be used to form a layer of material either or by solution growth (e.g. self assembly), solid growth (e.g. oxidation, nitridation, etc.), by annealing (e.g. annealing of ion-implanted silicon), vapor phase deposition (e.g. chemical or physical vapor deposition) of conductors, dielectrics, barriers and semiconductors.

By using a plurality of solution processing chambers, and layer formation chambers the equipment of FIG. 2 can be used to in-situ form layers of homogenous materials on top of each other. As a specific example, the equipment of FIG. 2 can be used to in-situ clean the silicon substrate, grow a monolayer of silicon dioxide, deposit high dielectric constant material, a barrier layer material and the conductor as the gate material. The gate-stack formed by the equipment and process described in the present invention will provide the desired performance and built-in reliability that is required for next generation of integrated circuits based on silicon metal-insulator field effect transistors. This is due to the fact at each stage of material formation, the homogeneity of microstructure is maintained and virtually no electrically active defects are formed.

What is claimed is:

1. An apparatus for forming at least one layer of substantially homogenous material on a substrate, said apparatus comprising:
   a processing chamber;
   a substrate support system within said processing chamber on which at least one substrate is disposed;
   an energy source connected to said processing chamber for providing at least one of thermal and a-thermal energy to said processing chamber;
   a reactant source connected to said processing chamber for providing reactants to said processing chamber; and
   a "smart controller" coupled to the processing chamber for "real-time" control of at least one of said energy sources and said reactant sources based on measured topography of the layer being formed, wherein the topography of the layer being formed is measured in "real-time" by an in-situ diagnostic tool.

2. The apparatus for forming at least one layer of substantially homogenous material, according to claim 1, wherein said "smart controller" is connected to said processing chamber by at least one of wired and wireless connections.

3. The apparatus for forming at least one layer of substantially homogenous material, according to claim 2, further comprising other controllers, said other controllers being disposed in at least one of in-situ or ex-situ relation to said processing chamber, said other controllers are being in connection with said "smart controller."

4. The apparatus for forming at least one layer of substantially homogenous material, according to claim 3, further comprising a diagnostic chamber and a topography storage mechanism in communication with said "smart controller," said storage mechanism for storing an ideal topography for said substantially homogenous layer.

5. The apparatus for forming at least one layer of substantially homogenous material, according to claim 4, wherein said energy source comprises an incoherent light source lamp assembly system having spectral disposed within said processing chamber and connected to said "smart controller," said incoherent light source lamp assembly system having an energy input controlled by said "smart controller."

6. The apparatus for forming at least one layer of substantially homogenous material, according to claim 5, further comprising a power supply system comprising a stack of power supplies and a control system for each of said power supplies, said power supply system being disposed outside the processing chamber, and said control system for each of said power supplies is connected to said "smart controller."

7. The apparatus for forming at least one layer of substantially homogenous material, according to claim 6, further comprising: a topography detection system disposed within said processing chamber to provide in-situ "real time" data to said "smart controller".

8. The apparatus of claim 1 and further comprising a separate thermal energy source and a separate a-thermal energy source, and wherein the smart controller independently controls such energy sources.

9. The apparatus of claim 8, wherein the smart controller independently controls the reactant source.

10. An apparatus for forming at least one layer of substantially homogenous material on a substrate, said apparatus comprising:
    a processing chamber;
    a substrate support system within said processing chamber on which at least one substrate is disposed, said substrate being at least one of patterned or unpatterned;
    a fluid source connected to said processing chamber for providing reactants to said processing chamber;
    at least one of thermal and a-thermal energy sources connected to said processing chamber such that spectral output of said energy sources is coupled to match absorption properties of said reactants used to form said substantially homogenous material layer; and
    a "smart controller" coupled to the processing chamber for "real-time" control of at least one of said energy sources and said reactant sources based on measured topography of the layer being formed, wherein the topography of the layer being formed is measured in "real-time" by an in-situ diagnostic tool.

11. The apparatus for forming at least one layer of substantially homogenous material, according to claim 10, wherein said at least one of said thermal and a-thermal energy sources comprises at least one of a resistive heater, incoherent light sources, lasers, plasma, sonic, and microwave.

12. The apparatus for forming at least one layer of substantially homogenous material, according to claim 10, wherein said thermal energy source comprises a photonic energy sources having spectral contents in the range of 50–200 nm and 200–400 nm range and located at least one of parallel to and perpendicular to a plane on which is disposed said substrate.

13. The apparatus for forming at least one layer of substantially homogenous material, according to claim 10, wherein said "smart controller" selectively controls appropriate amounts of thermal, sonic, optical, and plasma energy for a desired time to get a desired surface topography matching with an ideal surface of said patterned and unpatterned substrate.

14. An apparatus for forming at least one layer of substantially homogenous material on a substrate, said apparatus comprising:

a processing chamber;

a substrate support system within said processing chamber on which at least one substrate is disposed, said substrate being at least one of patterned or unpatterned;

a fluid source connected to said processing chamber for providing reactants to said processing chamber;

at least one in-situ diagnostic tool for measuring a topography of a layer being formed in "real-time";

at least one of thermal and a-thermal energy sources connected to said processing chamber such that spectral output of said energy sources is coupled to match absorption properties of said reactants used to form said substantially homogenous material layer; and a "smart controller" coupled to the processing chamber for "real-time" control of at least one of said energy sources and said reactant sources, wherein said "smart controller" controls said fluid source into said processing chamber and said energy sources such that energy wavelength is coupled to an absorption peak of said reactant used.

15. An apparatus for forming at least one layer of substantially homogenous material on a substrate, said apparatus comprising:

a processing chamber;

an energy source connected to said processing chamber for providing at least one of thermal and a-thermal energy to said processing chamber wherein said energy source is interchangeable;

a ring assembly disposed about the perimeter of said substrate support system within said processing chamber, said ring having a plurality of distribution portals for uniform distribution of said reactants, said plurality of distribution portals having a predetermined size, location, and number, wherein said ring assembly is interchangeable;

a fluid source connected to said processing chamber for providing reactants to said processing chamber wherein said fluid source is interchangeable; and a "smart controller" coupled to the processing chamber for "real-time" control at least one of said energy source and said fluid source based on measured topography of the layer being formed wherein the topography of the layer being formed is measured in "real-time" by an in-situ diagnostic tool.

* * * * *